United States Patent [19]

Yasutake et al.

[11] Patent Number: 4,853,870

[45] Date of Patent: Aug. 1, 1989

[54] ELECTRON BEAM EXPOSURE SYSTEM

[75] Inventors: Nobuyuki Yasutake; Jun-ichi Kai, both of Tokyo; Hiroshi Yasuda, Yokohama; Kenichi Kawashima, Sagamihara, all of Japan

[73] Assignee: Fujitsu Limited, Kawasaki, Japan

[21] Appl. No.: 54,782

[22] Filed: May 27, 1987

[30] Foreign Application Priority Data

May 27, 1986 [JP] Japan ................. 61-120235

[51] Int. Cl.⁴ .................................. G06F 15/62
[52] U.S. Cl. ..................... 364/490; 250/396 R; 250/492.2; 364/491; 364/518; 364/571.01
[58] Field of Search .......... 250/492.22, 396 R; 364/490, 491, 560, 571, 518, 571.01

[56] References Cited

U.S. PATENT DOCUMENTS

| | | | |
|---|---|---|---|
| 3,900,737 | 8/1975 | Collier et al. | 250/492.22 |
| 4,119,854 | 10/1978 | Tanaka et al. | 250/492.22 X |
| 4,147,937 | 4/1979 | Buelow et al. | 250/492.22 |
| 4,494,004 | 1/1985 | Mauer, IV et al. | 250/492.22 |
| 4,585,943 | 4/1986 | Yasuda et al. | 250/396 R |
| 4,600,837 | 7/1986 | Di Stefano et al. | 250/235 |
| 4,607,333 | 8/1986 | Yasutake et al. | 364/490 X |
| 4,628,466 | 12/1986 | Tymes | 364/491 X |
| 4,647,782 | 3/1987 | Wada et al. | 250/492.22 |
| 4,728,797 | 3/1988 | Gotou et al. | 364/490 X |

OTHER PUBLICATIONS

G. L. Varnell et al., High Speed Electron Beam Pattern Generation, pp. 97 to 110, Texas Instruments Incorporated.

Primary Examiner—Parshotam S. Lall
Assistant Examiner—Edward R. Cosimano
Attorney, Agent, or Firm—Staas & Halsey

[57] ABSTRACT

In an electron beam exposure system controlled by a computer, the system includes: an electron optical device for generating electron beams and irradiating the beams to a sample on a stage through a plurality of electron lens, a main deflection coil, and sub deflection electrodes, to form predetermined circuit patterns on the sample. The system also includes a position control device controlling the driving of the stage based on a stage position coordinate designated by the computer, detecting an actual stage position coordinate, and calculating an error value between the designated stage position coordinate and the actual stage position coordinate, the error value being divided into two components of an upper bits portion having an relatively large error value and a lower bits portion having a relatively small error value, and a deflection control device controlling the direction of the electron beams based on the main pattern data corrected by the upper bits portion and the sub pattern data corrected by the lower bits portion, and based on selected main and sub wait times determined by exposure and non-exposure timings.

9 Claims, 9 Drawing Sheets

ELECTRON BEAM EXPOSURE SYSTEM

BACKGROUND OF THE INVENTION

1. Field of the Invention

The present invention relates to an electron beam exposure system controlled by a computer, more particularly, it relates to an electron beam exposure system in which movement of a state is continuous.

2. Description of the Related Art

Recently, there have been considerable developments of the electron beam exposure system used for exposing fine patterns during the process of manufacturing VLSI's. In a known electron beam exposure system, a step-and-repeat method is used for exposing fine patterns. In this step-and-repeat method, the exposure by the electron beam is performed at each "main field", which is an area to be exposed. One main field is equal to an effective chip area, and is divided into a plurality of sub fields. In this method, after the exposure of one main field is finished, a stage is moved to a center position of the next field to be exposed and the exposure is started at each sub field in the next field, after adjusting the position of the electron beam. In this case, the position of the electron beam is readjusted by a main deflector consisting of deflection coils and a sub deflector consisting of deflection electrodes, at each field.

In this method, the exposure is interrupted during movement of the stage, and thus a loss of exposure time is incurred.

SUMMARY OF THE INVENTION

The object of the present invention is to provide an electron beam exposure system enabling a precise and high speed continuous exposure by electron beam during movement of the stage.

In accordance with the present invention, there is provided an electron beam exposure system controlled by a computer including: an electron optical device for generating electron beams and irradiating the beams to a sample on a stage through a plurality of electron lens, a main deflection coil, and sub deflection electrodes, to form predetermined circuit patterns on the sample. The present invention also includes a position control unit for controlling the driving of the stage based on a stage position coordinate designated by the computer, detecting an actual stage position coordinate, and calculating an error value between the designated stage position coordinate and the actual stage position coordinate, the error value being divided into two components of an upper bits portion having a relatively large error value and alower bits portion having a relatively small error value, the upper bits portion being input to a main deflection unit for correcting the direction of the electron beams to a relatively large extent, and the lower bits portion being input to a sub deflection unit for correcting the direction of the electron beams to a relatively small extent; and a deflection control unit for controlling the direction of the electron beams based on main pattern data corrected by the upper bits portion and sub pattern data corrected by the lower bits portion, and based on a selected main and sub wait time determined by the exposure and nonexposure timing.

DESCRIPTION OF THE PREFERRED EMBODIMENTS

An electron beam exposure system according to the present invention will be explained in detail hereinafter.

Figure 1:
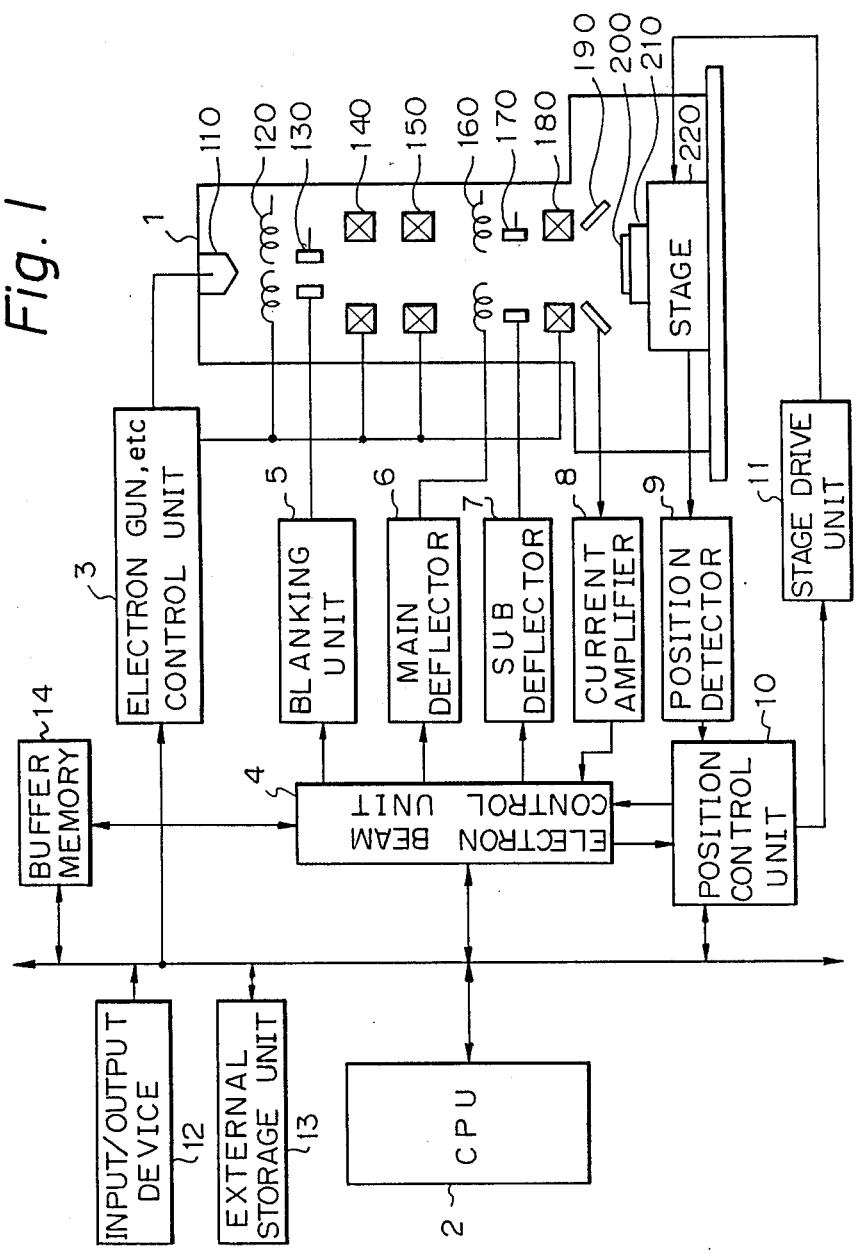
FIG. 1 is a schematic block diagram of an electron beam exposure system according to an embodiment of the present invention.

In FIG. 1, reference number 1 denotes a body in the electron beam exposure system. Three electron lens 140, 150 and 180, a main deflection means, for example, deflection coils 160, sub deflection means, for example, deflection electrodes 170, a stage 220, and the like are provided in an inner space of the body as an electron optical means. This inner space is usually maintained in a high vacuum state. Reference number 2 denotes a central processing unit (CPU) of the computer controlling all units of this system. Reference number 3 denotes a control unit for an electron gun 110, the three electron lens 140, 150 and 180, an alignment coil 120, and the like. Provided as a deflection control means are, an electron beam control unit 4, a blanking control unit 5, a main deflector control 6, a sub-deflector control 7, and a current amplifier 8. Provided as a position control means are, a position detector 9, a position control unit 10, and a stage drive unit 11. Reference number 12 denotes an input/output device, 13 an external storage unit, and 14 a buffer memory.

In the electron beam exposure system according to the present invention, a precise and high speed exposure is achieved through the provision of the improved electron beam control unit 4 and the improved position control unit 10, as explained in detail hereinafter. Basically, in this system, the position data for the stage is transferred from the CPU 2 to the position control unit 10. The stage drive unit 11 is driven by a control signal from the unit 10, and the stage 220 is moved to the designated position. The position of the stage 220 is detected by the position detector 9, and a difference between a designated position (target position) and an actual position is detected by the position control unit 10 as an error value. This error value is fed back to the main deflector control 6 and the sub deflector control 7, and the direction of the electron beam is adjusted by main deflector control 6 and sub-deflection control 7 based on the error value. In this case, the error value is divided into two components, i.e., a relatively large error component and a relatively small error component. The large error component is transferred to the main deflector control 6 and the small error component is transferred to the sub deflector control 7, as explained in detail hereinafter.

Figure 2A:
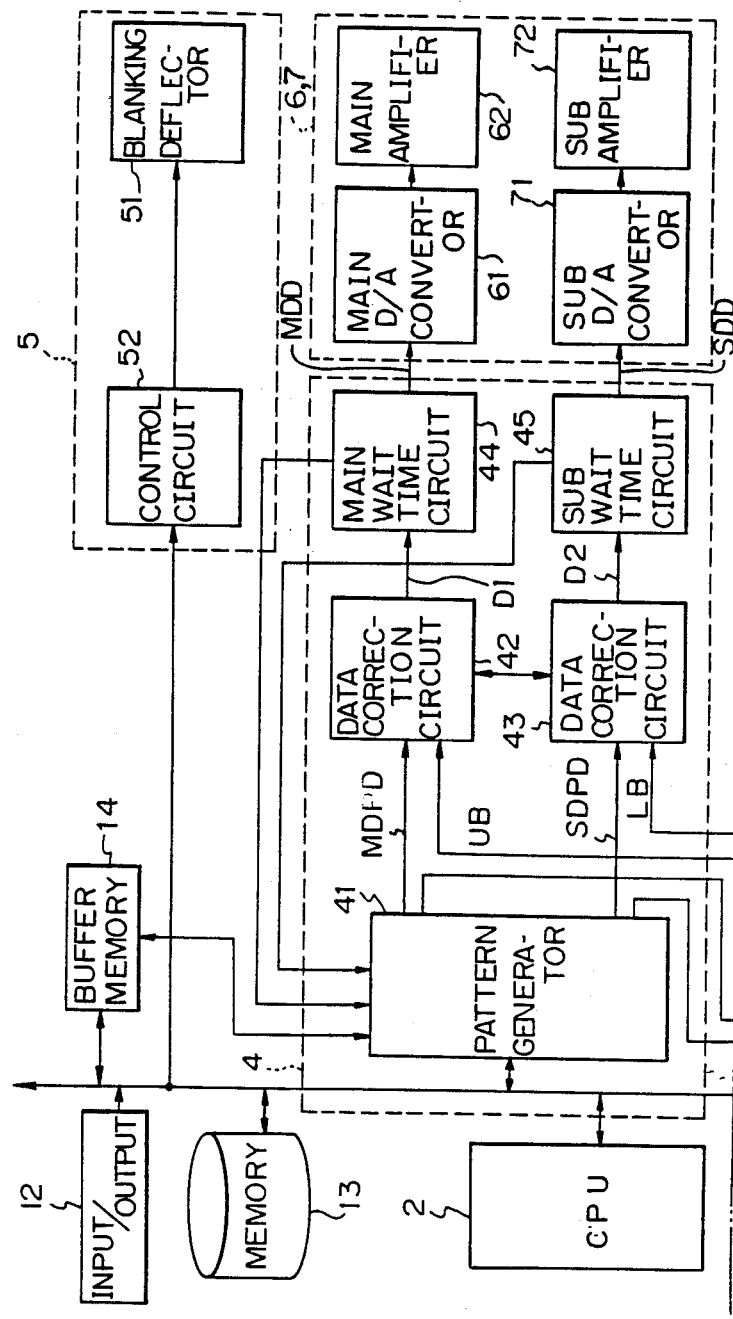
FIGS. 2A and 2B comprise a detailed block diagram of the system shown in FIG. 1.
Figure 2B:
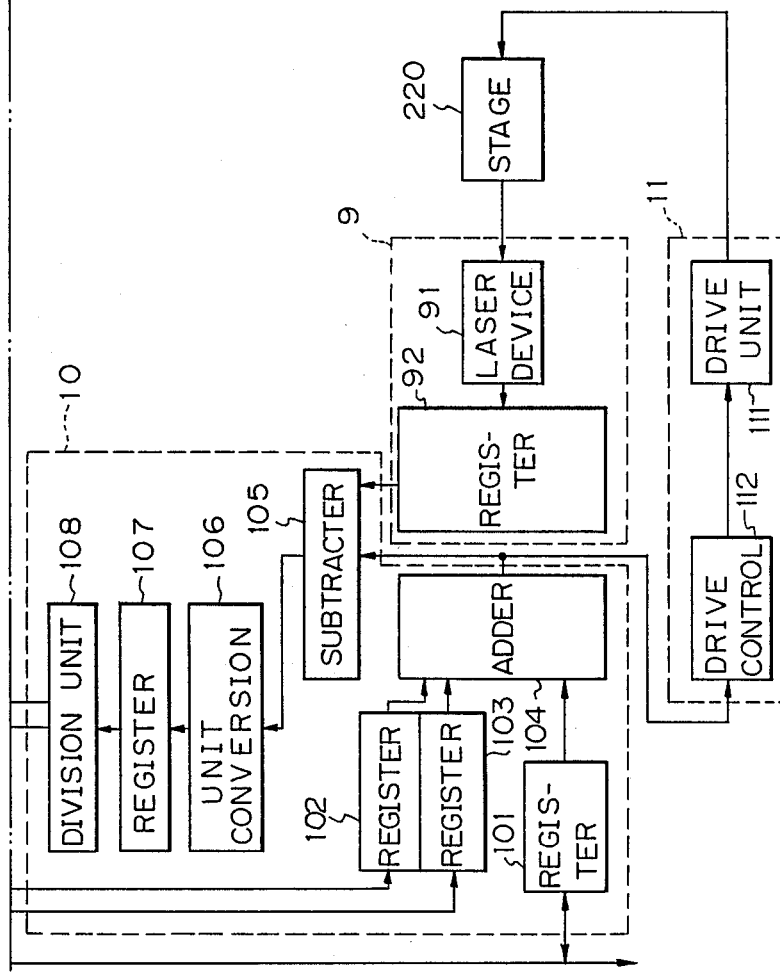

As shown in FIGS. 2A and 2B, the electron beam control unit 4 comprises: a pattern generator 41 for generating main and sub deflector pattern data; main and sub deflector correction circuits 42, 43 for correcting position data of the circuit patterns by the error value; and main and sub-deflector wait time circuits 44, 45 for selecting exposure and non-exposure periods in a blanking signal pulse.

The position control unit 10 comprises: a designated value register 101 for storing the stage position data to be moved from the CPU; two registers 102, 103 for storing the data for the main and sub deflector controls 6 and 7, respectively, from the pattern generator 41; and adder 104 for adding these data of the registers 101, 102 and 103; a subtractor 105 for calculating the error value between the designated position and actual position of the stage 220; an unit conversion circuit 106 for unit conversion of a laser wavelength unit to a pattern bit data unit; a register 107 for inputting the converted pattern bit data; and an error value division circuit 108 for dividing the above error bit data into two components, i.e., an upper bits portion and a lower bits portion.

The position detector 9 comprises a conventional laser distance measuring device 91 for detecting the position of the stage 220 and a register 92 for inputting the detected value. The stage drive unit 11 comprises a drive circuit 111 and a control circuit 112. The blanking unit 5 comprises a blanking deflector 51 and a control circuit 52. The input/output device 12 applies an initial start command to the CPU and displays various data. The external storage unit 13 is, for example, a magnetic disk or a magnetic tape. The buffer memory 14 is a memory for temporarily storing pattern data to be exposed. The main deflector control 6 comprises a main D/A convertor 61 and a main amplifier 62. The sub deflector control 7 comprises a sub D/A convertor 71 and a sub amplifier 72.

Figure 3:
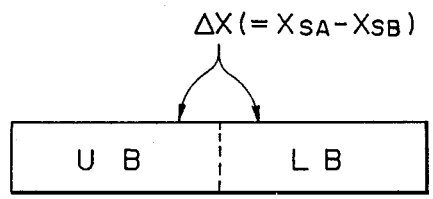
FIG. 3 is a view explaining an upper bits portion and a lower bits portion based on an error value.
Figure 3:
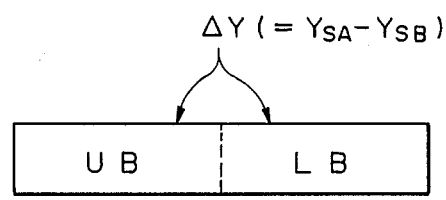

In FIG. 3, $(X_{SA}, Y_{SA})$ is a stage position coordinate (X-Y axis) designated by the CPU, and $(X_{SB}, Y_{SB})$ is an actual stage position coordinate detected by the position detector 9. The coordinate $(X_{SA}, Y_{SA})$ is output from the adder 104, and the coordinate $(X_{SB}, Y_{SB})$ is output from the register 92. Accordingly, $\Delta X$ represents the error value between $X_{SA}$ and $X_{SB}$, and $\Delta Y$ represents the error value between $Y_{SA}$ and $Y_{SB}$. The error values $\Delta X$ and $\Delta Y$ are divided into the upper bits portion UB and the lower bits portion LB. The lower bits portion LB carries an error value of, for example, less than 20.48 $\mu$m, and the upper bits portion UB carries an error value of, for example, more than 20.48 $\mu$m. The large error value of the upper bits portion UB is fed back to the main deflector control 6 and the small error value of the lower bits portion LB is fed back to the sub deflector control 7. The values $\Delta X$ and $\Delta Y$ are calculated in the subtractor 105 and divided into two components, i.e., the upper and lower bits portions, by the division circuit 108. Therefore, when the error value is relatively small, the direction of the beam is adjusted by the sub deflector control 7, and when the error value is relatively large, the direction of the beam is adjusted by the main deflector control 6.

Figure 4A:
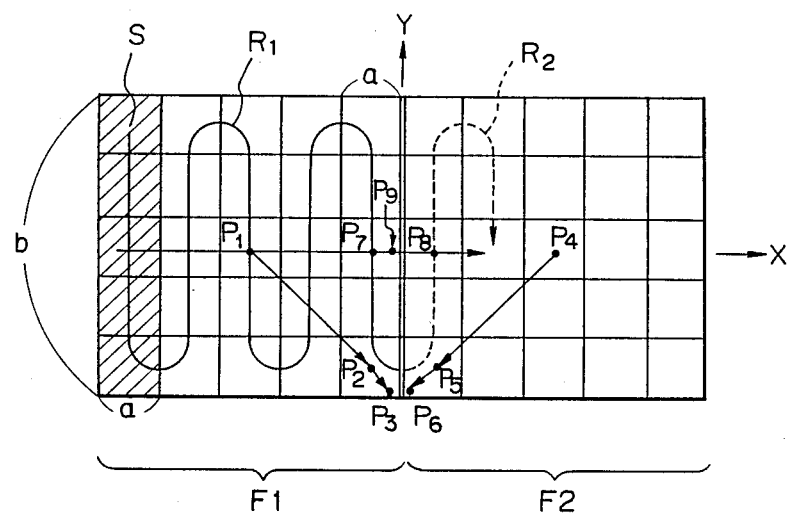
FIGS. 4A and 4B are views explaining exposure steps in sub fields and main fields.
Figure 4B:
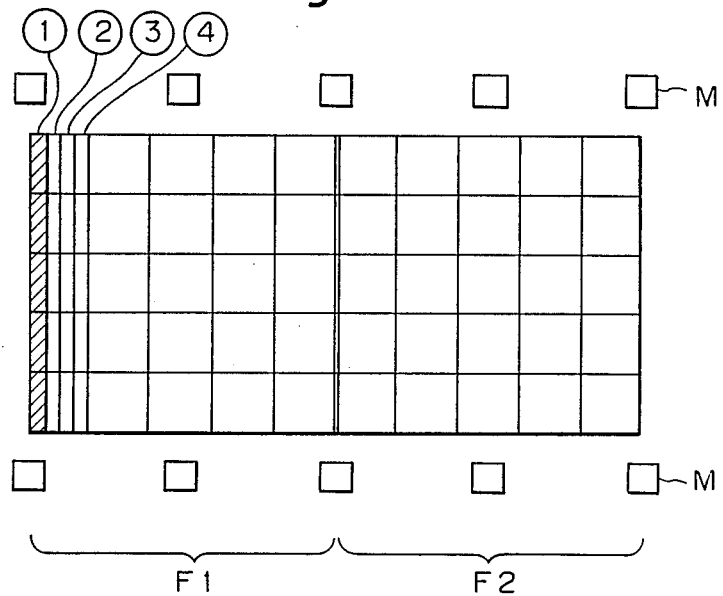

In FIGS. 4A and 4B, $F_1$ and $F_2$ are main fields, S a sub field, and M a marker. The main field ($F_1$, $F_2$) is generally constituted by an area approximtely 5 mm square, i.e., the size of an IC chip. The sub field is generally constituted by an area approximately 100 $\mu$m square.

The exposure by the electron beam is performed at each sub field S, and the beam direction in the sub field S is controlled by the sub deflector control 7 and the beam direction between each sub field is controlled by the main deflector control 6. That is, the beam can be swung to a large extent, as shown by the slant line area (a×b), by the main deflector 6. As explained above, although the sub deflector 7 can carry out a precise and high speed swing of the electron beam, only a narrow area can be covered thereby. The main deflector 6, however, can swing the beam over a wide area, but can not swing the beam at a high speed achieved by the sub deflector control 7.

In FIG. 4A, the stage is moved in the X direction ($P_1 \rightarrow P_4$). The exposure of the pattern is started from the subfield S and carried out along the route $R_1$ (solid line) in the main field $F_1$, using the main and sub deflector controls 6 and 7. When the exposure in the main field $F_1$ is finished, the exposure is carried out for the main field $F_2$, as shown by the dotted line. To ensure the compatibility between the stage consecutive movement exposure method and the conventional step-and-repeat method, the stage position coordinate in the main field $F_1$ is set to $P_1$ ($X_{S1}, Y_{S1}$). Further, as the last pattern position data in the main field $F_1$, the main data is given by $P_1P_2$ ($X_{M1}, Y_{M1}$) and the sub data $P_2P_3$ ($x_{S1}, y_{S1}$). Next, in case of the step-and-repeat method, the stage position coordinate to be moved is $P_4$ ($X_{S2}, Y_{S2}$), the first main data is $P_4P_5$ ($X_{M2}, Y_{M2}$), and the sub data is $P_5P_6$ ($x_{S2}, y_{S2}$) in the main field $F_2$.

The stage position coordinate when the exposure in the main field $F_1$ is completed by the stage consecutive movement method is, for example, $P_7$ ($X_{S1}+X_M, Y_{S1}$). At this time, the main data is $P_7P_2$ (O, $Y_{M1}$) and the sub data is $P_2P_3$ ($x_{S1}, y_{S1}$). In order to expose the main field $F_2$, the stage designated position coordinate is $P_8$ ($X_{S2}+X_{M2}, Y_{S2}$), the main data is $P_8P_5$ (O, $Y_{M2}$), and the sub data is $P_5P_6$ ($x_{S2}, y_{S2}$). The stage position data $P_4$ ($X_{S2}, Y_{S2}$) is stored in the register 101. The data $P_4P_8$ ($X_{M2}$, O) to be added to the stage position data, although it is the main data, is stored in the register 102. The main data $P_8P_5$ (O, $Y_{M2}$) and the sub data $P_5P_6$ ($x_{S2}, y_{S2}$) are transferred from the pattern generator 41 to the data correction circuits 42 and 43. In this case, since the present stage position is $P_7$, although the designated position is $P_8$, the stage position error value is given by the distance ($X_{S2}+X_{M2}-X_{S1}-X_{M1}, Y_{S2}-Y_{S1}$). This error value is divided into the upper bits portion UB and the lower bits portions LB and transferred to the data correction circuits 42 and 43. In the main field, $F_2$, when the main data is changed, the content of the register is rewritten.

In general, the stage position data ($X_S, Y_S$), the main data ($X_M, Y_M$), and the sub data ($x_S, y_S$) can be divided as follows.

| | | |
|---|---|---|
| $X_S$ | = | $X_{Sl1} + X_{S12} + X_{S13}$ |
| $Y_S$ | = | $Y_{Sl1} + Y_{S12} + Y_{S13}$ |
| $X_M$ | = | $X_{Ml1} + X_{M12} + X_{M13}$ |
| $Y_M$ | = | $Y_{Ml1} + Y_{M12} + Y_{M13}$ |
| $x_S$ | = | $x_{Sl1} + x_{S12} + x_{S13}$ |
| $y_S$ | = | $y_{Sl1} + y_{S12} + y_{S13}$ |

Based on the above data, new stage position data ($X_{SN}, Y_{SN}$), main data ($X_{MN}, Y_{MN}$), and sub data ($x_{SN}, y_{SN}$) are given as follows.

| | | |
|---|---|---|
| $X_{SN}$ | = | $X_{SI1} + X_{MI1} + X_{SI1}$ |
| $Y_{SN}$ | = | $Y_{SI1} + Y_{MI1} + Y_{SI1}$ |
| $X_{MN}$ | = | $X_{S12} + X_{M12} + X_{S12}$ |
| $Y_{MN}$ | = | $Y_{S12} + Y_{M12} + Y_{S12}$ |
| $x_{SN}$ | = | $x_{S13} + x_{M13} + x_{S13}$ |
| $y_{SN}$ | = | $y_{S13} + y_{M13} + y_{S13}$ |

In the new stage position data ($X_{SN}$, $Y_{SN}$), the data ($X_{S11}$, $Y_{S11}$), ($X_{M11}$, $Y_{M11}$) and ($x_{S11}$, $y_{S11}$) are stored in the registers 101, 102 and 103. The main data ($X_{MN}$, $Y_{MN}$) and the sub data ($x_{SN}$, $y_{SN}$) are transferred from the pattern generator to the data correction circuits 42 and 43.

In FIG. 4A, when the stage consecutive movement is carried out, it is necessary to deflect the beam to the X direction by the maximum deflection value a when the stage position is P9. A method for reducing this deflection value is shown in FIG. 4B. In this case, the sub field is divided into for example, narrow four portions ① to ④ in the X direction. The exposure is carried out in sequence form ① to ④ by consecutive movements of the stage.

Figure 6:
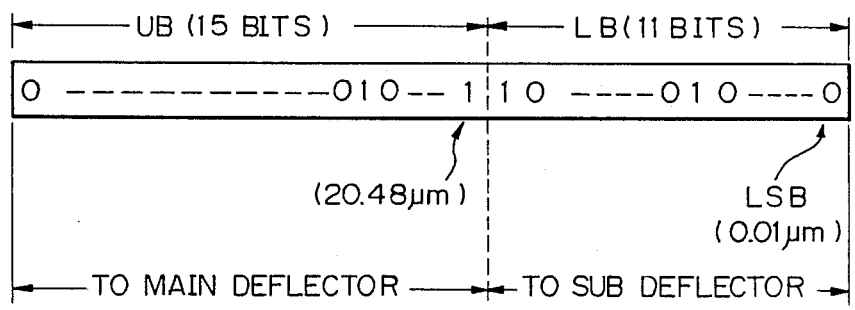
FIG. 6 is a view explaining one example of the upper and lower bits portions.
Figure 5:
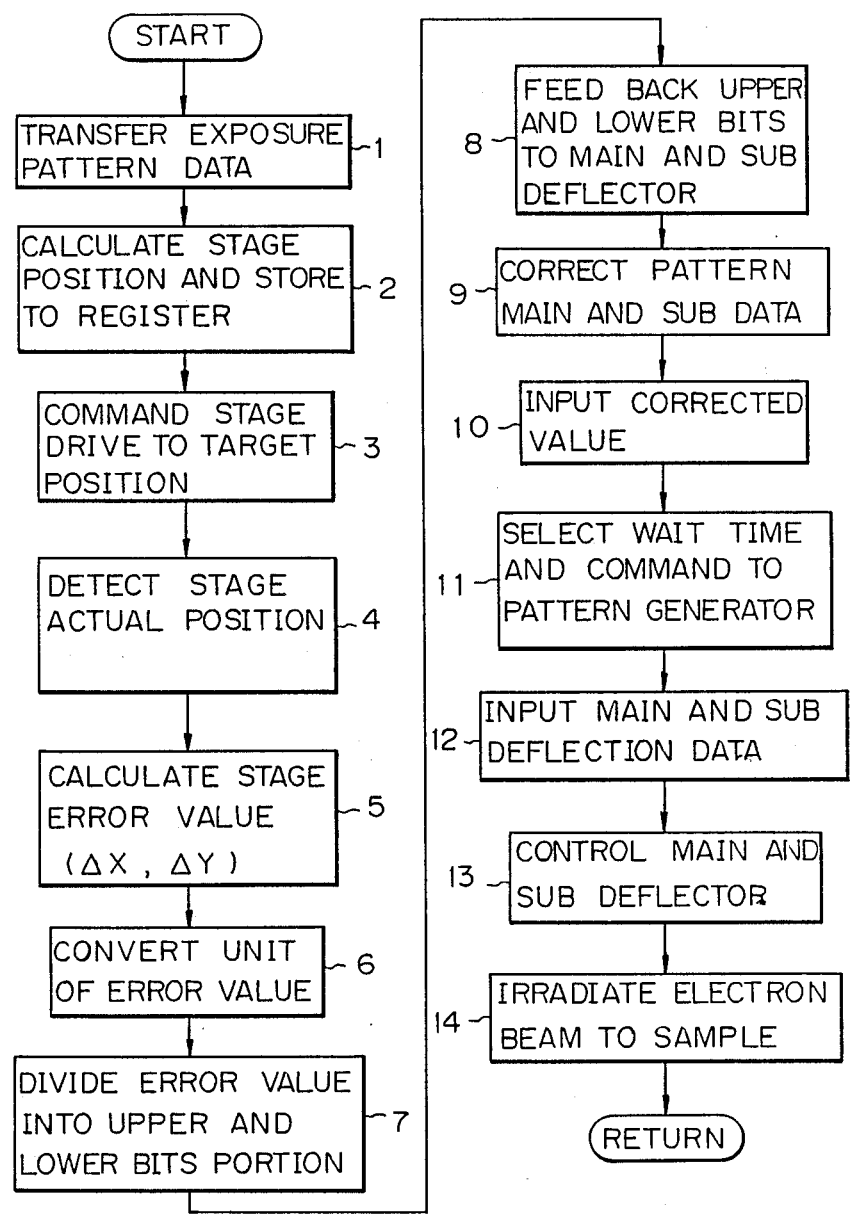
FIG. 5 is a flowchart explaining control steps of the system shown in FIG. 2.

As shown in the flow chart of FIG. 5, the pattern data to be exposed is transferred from the external storage unit 13 to the buffer memory 14, under the control of the CPU 2 (step 1). The designated stage position coordinate ($X_{SA}$, $Y_{SA}$) to be moved is calculated in the CPU 2, and the resultant data is stored in the register 101 (step 2). The output of the adder 104, i.e., the resultant data calculated in the CPU 2, is input to the stage drive control circuit 112, and the stage 220 is moved to the designated position coordinate (step 3). The present position of the stage 220 is detected by the laser distance measuring device 91 and this data is stored in the register 92 (step 4). The difference between the designated position and the present position, i.e., the error value of the stage 220-position ($\Delta X$, $\Delta Y$), is calculated in the subtractor 105 (step 5). The unit of this error value is converted from the laser wavelength unit to the pattern data unit by the conversion circuit 106 (step 6). For example, in the case of an He-Ne gas laser, 1 LSB is equal to 0.0052733 μm. This value can be found by the formula 1 $LSB = 0.6328/N$ where the value 0.6328 is a wavelength of the laser, N is the division number of one wavelength of the laser (for example, N=120), and LSB is the least significant bit. In the pattern data, the LSB value is, in general, set to 0.01 μm, and therefore, the unit conversion circuit 106 converts the former (0.0052733 μm) to the latter (0.01 μm) as one LSB. Each of the error values ($\Delta X$ and $\Delta Y$) is divided into the upper bits portions UB and the lower bits portion LB in the division circuit 108 (step 7) as shown in FIGS. 3 and 6. For example, the lower bit portion is constituted by 11 bits and the upper bit portion is constituted by 15 bits, as shown in FIG. 6. In FIG. 6, the low bits portion LB is input to the sub deflector control 7 and the upper bits portion UB is input to the main deflector control 6 (step 8). In this case, the value 10.88 μm is fed back to the sub deflector control 7, and the value 348.16 μm is fed back to the main deflector control 6.

The error value UB and the main deflection pattern data (MDPD) are input to the data correction circuit 42 and the MDPD is corrected by the UB (step 9). This correction of the main deflection pattern data is carried out for a gain value, an offset value, a rotation value, a hexagonal value, and the like, in the conventional method and the error value UB is added to these values.

The same correction as the above is performed by the data correction circuit 43 for the sub deflection pattern data (SDPD) and the error value LB, and the corrected data is input to the wait time circuits 44 and 45. That is, the output data D1 of the correction circuit 42 is input to the wait time circuit 44, and the output data D2 of the correction circuit 43 is input to the wait time circuit 45 (step 10).

Figure 7:
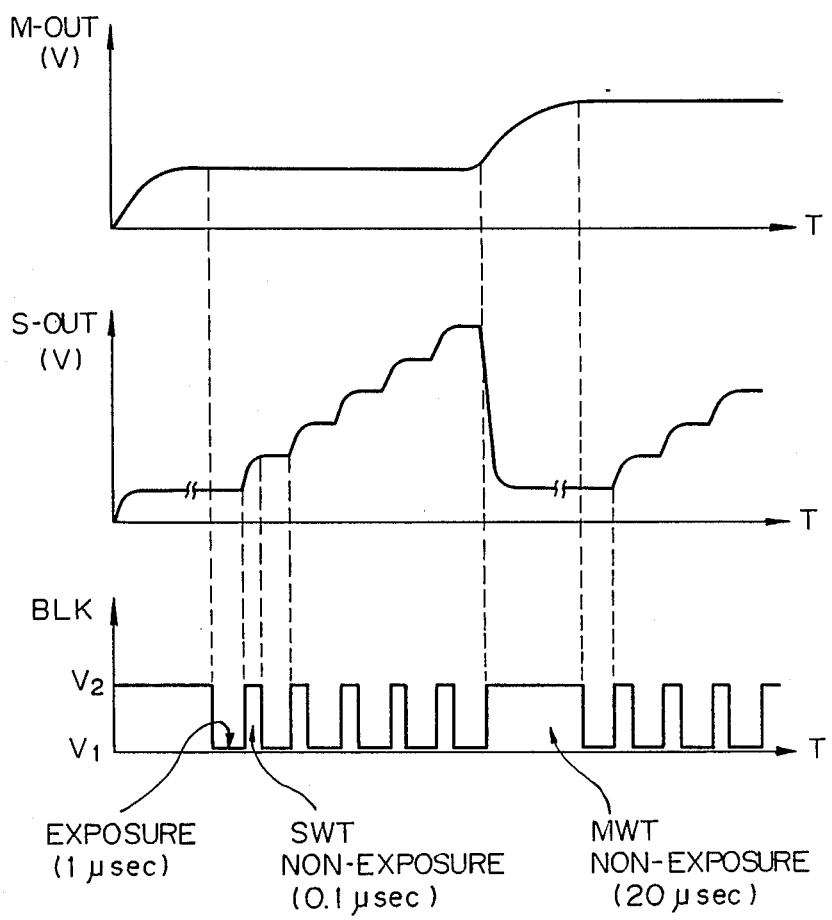
FIG. 7 is a graph explaining exposure timing and a blanking signal.

In this case, the wait time WT corresponding to the movement distance ($X_{MN1} - X_{MN2}$) by the main deflector control 6 is selected in the wait time circuit and this wait time is returned to the pattern generator 41. The output of the pattern generator 41 is held during this wait time (step 11). This is explained in FIG. 7 as the exposure timing. In FIG. 7, the ordinates are a main deflector output voltage (M-OUT), a sub deflector output voltage (S-OUT), and a blanking signal (BLK), and each of the abscissas is a time (T). When the level of the blanking signal BLK is $V_1$ (=0V), the exposure is performed; this exposure time is about 1 μsec. When the level of the blanking signal BLK is $V_2$ (=approximately 30V), the exposure is not performed. This non-exposure period SWT is equal to the wait time of the sub deflector control 7. The other non-exposure period MWT is equal to the wait time of the main deflector control 6. In general, the exposure time is 1 μsec, the wait time SWT is 0.1 μsec, and the wait time MWT is 20 μsec. As obvious from the graph, the setting time to the next exposure is changed in correspondence with the pattern jumping distance. Therefore, since the wait time MWT of the main deflector control 6 is long and that of the sub deflector control 7 is short, the exposure can be performed in the sub field and main field.

The main deflection data MDD is input to the main deflection D/A converter 61 and the sub deflection data SDD is input to the sub deflection D/A converter 71 (step 12). The analog data is amplified by the main amplifier 62 and the sub amplifier 72 and applied to the deflection coil 160 and the deflection electrode 170 to control the direction of the electron beam (step 13). Once the control parameters are input to the main deflection means 160 and the sub deflection means 170, the electron optical device generates an electron beam to irradiate the sample (step 14).

Figure 8:
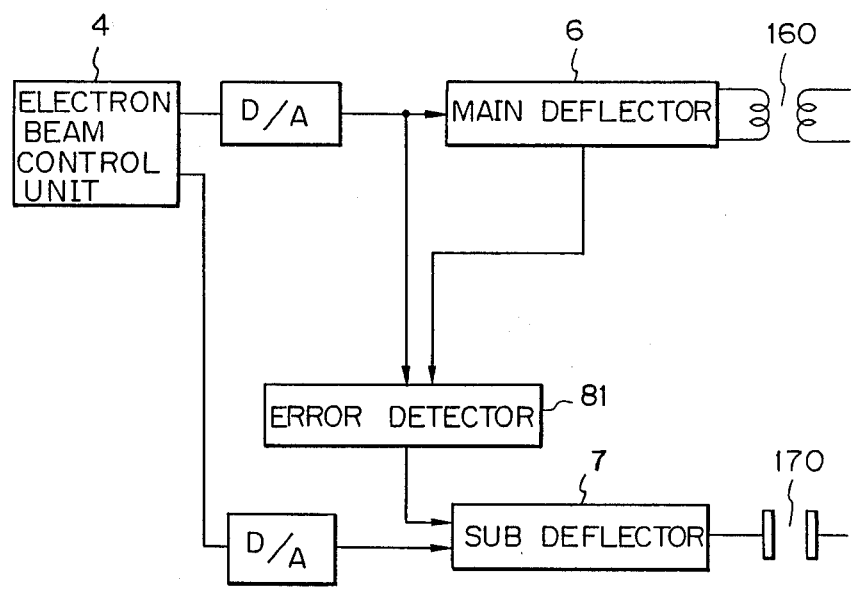
FIG. 8 is a partial block diagram of the electron beam exposure system according to another embodiment of the present invention.

In FIG. 8, reference number 81 denotes an error detector. Since the response by the main deflector control 6 is, in general, slow compared with that of the sub deflector control 7, a response delay portion of the stage error value occurs in the main deflector control 6, and this response delay portion is detected by the error detector 81 and applied to the sub deflector control 7.

Figure 9:
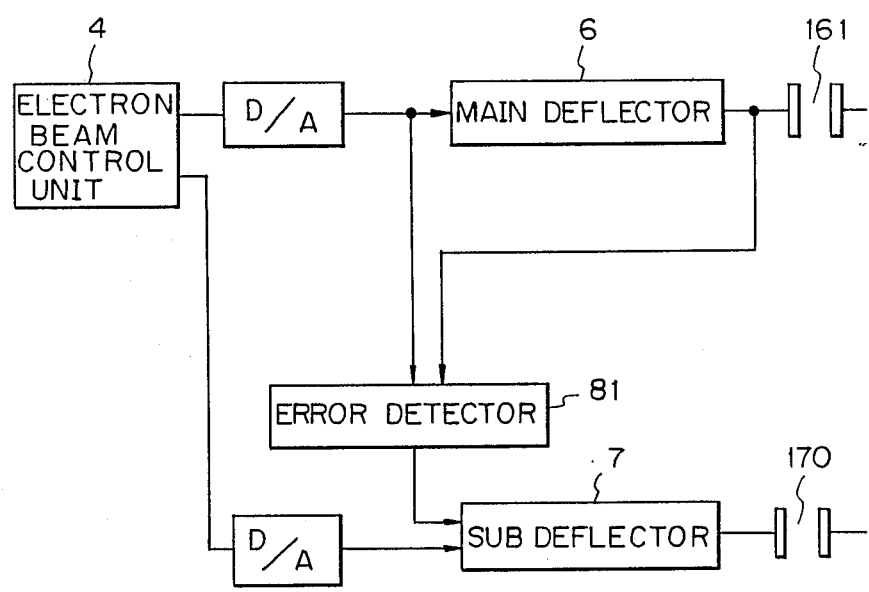
FIG. 9 is a partial block diagram of the electron beam exposure system according to still another embodiment of the present invention.

In FIG. 9, another example of the deflection control is shown. In this example, main deflection means comprises deflection electrodes 161. In this embodiment, the operation is the same as that FIG. 8.

We claim:

1. An electron beam exposure system controlled by a computer, comprising:

electron optics means for generating electron beams and for irradiating said electron beams to a sample on a stage through electron lens means, main deflection means, and sub deflection electrode means, to form predetermined circuit patterns on said sample;

position control means for controlling a drive of said stage based on a stage position coordinate designated by said computer, detecting an actual stage position coordinate, and calculating an error value between said designated stage position coordinate and said actual stage position coordinate, said error value being divided into two components of an upper bits portion having a relatively large error value and a lower bits portion having a relatively small error value, said upper bits portion being input to a main deflection means for correcting a direction of said electron beams to a relatively large extent, and said lower bits portion being input to a sub deflection means for correcting a direction of said electron beams to a relatively small extent; and a deflection control means for controlling a direction of said electron beams based on main pattern data corrected by said upper bits portion and sub pattern data corrected by said lower bits portion, and based on selected main and sub wait times determined by an exposure and non-exposure timing.

2. An electron beam exposure system as claimed in claim 1, wherein said position control means comprises:
designated value register means, having an output, for temporarily storing position coordinates for movement of said stage;
main registers means, having an output, for temporarily storing main pattern data;
sub register means, having an output, for temporarily storing sub pattern data;
adding means for adding the output of said designated value register means, the output of said main register means and the output of said sub register means;
subtracting means for calculating said error value between said designated stage position coordinate and said actual stage position coordinate;
unit conversion means for converting a laser wavelength unit to a pattern data unit; and
division means for dividing said error value into said upper bits portion and said lower bits portion.

3. An electron beam exposure system as claimed in claim 1, wherein said main deflection means and said sub deflection means each comprise a deflection coil.

4. An electron beam exposure system as claimed in claim 1, wherein the computer controls the system by a stage consecutive movement method.

5. An electron beam exposure system as claimed in claim 1, wherein said main deflection means and said sub deflection means each comprise deflection electrodes.

6. An electron beam exposure system as claimed in claim 1, wherein said main deflection means comprises a deflection coil and said sub deflection means comprises detection electrodes.

7. An electron beam exposure system as claimed in claim 1, wherein said deflection control means comprises:
pattern generator means for generating predetermined main detector control pattern data and sub detector control pattern data;
main detector correction means for correcting said main detector control pattern data based on said upper bits portions;
sub deflector correction means for correcting said sub detector control pattern data based on said lower bits portions and main and sub wait time means for selecting main and sub wait times determined by exposure and non-exposure timings.

8. An electron beam exposure system as claimed in claim 7, wherein said deflection control means further comprises error detection means for detecting a response delay of said error value occurring in said main deflection means and for applying said response delay to said sub deflection means.

9. An electron beam exposure system controlled by a computer, comprising:
stage means;
electron optics means for generating electron beams and irradiating said electron beams onto said stage means;
position control means for controlling movement of said stage means by determining a difference between a target position of said stage means and an actual position of said stage means, the difference being an error value, and dividing said error value into a high error value portion and a low error value portion; and
deflection control means for controlling said electron beams based on said high error value portion and said low error value portion.

* * * * *